(12) United States Patent
Seong et al.

(10) Patent No.: US 8,754,391 B2
(45) Date of Patent: Jun. 17, 2014

(54) NONVOLATILE MEMORY DEVICES AND METHODS OF FABRICATING THE SAME

(75) Inventors: Dong-Jun Seong, Hwaseong-si (KR); Chan-Jin Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 41 days.

(21) Appl. No.: 13/366,875

(22) Filed: Feb. 6, 2012

(65) Prior Publication Data
US 2012/0286226 A1 Nov. 15, 2012

(30) Foreign Application Priority Data
May 12, 2011 (KR) .......................... 10-2011-0044612

(51) Int. Cl.
*H01L 29/00* (2006.01)
*H01L 47/00* (2006.01)
(52) U.S. Cl.
USPC ........................................ 257/1; 257/E45.001
(58) Field of Classification Search
USPC ........................... 257/278, 231, E27.026, 1–5, 257/E45.001–E45.003, E21.614
See application file for complete search history.

(56) References Cited

U.S. PATENT DOCUMENTS

| | | | | |
|---|---|---|---|---|
| 2009/0001419 A1* | 1/2009 | Han et al. | ....................... | 257/190 |
| 2009/0242966 A1* | 10/2009 | Son et al. | ....................... | 257/324 |
| 2010/0090191 A1* | 4/2010 | Lee et al. | ......................... | 257/3 |
| 2010/0248439 A1* | 9/2010 | Chung et al. | .................. | 438/287 |
| 2011/0024816 A1* | 2/2011 | Moon et al. | ..................... | 257/314 |
| 2011/0085368 A1* | 4/2011 | Kim et al. | ........................ | 365/63 |
| 2011/0180941 A1* | 7/2011 | Hwang et al. | ................ | 257/786 |
| 2011/0227141 A1* | 9/2011 | Jeong et al. | .................... | 257/324 |
| 2011/0316063 A1* | 12/2011 | Tang et al. | .................... | 257/314 |
| 2012/0028450 A1* | 2/2012 | Son et al. | ....................... | 438/479 |
| 2012/0068242 A1* | 3/2012 | Shin et al. | ...................... | 257/315 |
| 2012/0070944 A1* | 3/2012 | Kim et al. | ..................... | 438/128 |
| 2012/0108048 A1* | 5/2012 | Lim et al. | ...................... | 438/586 |
| 2012/0161094 A1* | 6/2012 | Huo et al. | ......................... | 257/4 |
| 2012/0217564 A1* | 8/2012 | Tang et al. | .................... | 257/315 |

FOREIGN PATENT DOCUMENTS

| | | |
|---|---|---|
| JP | 2009277770 A | 11/2009 |
| JP | 2010199348 A | 9/2010 |
| KR | 20100033303 A | 3/2010 |

* cited by examiner

*Primary Examiner* — Daniel Luke
*Assistant Examiner* — Latanya N Crawford
(74) *Attorney, Agent, or Firm* — Harness, Dickey & Pierce, P.L.C.

(57) ABSTRACT

Nonvolatile memory devices including a first interlayer insulating film and a second interlayer insulating film separated from each other and are stacked sequentially, a first electrode penetrating the first interlayer insulating film and the second interlayer insulating film, a resistance change film along a top surface of the first interlayer insulating film, side surfaces of the first electrode, and a bottom surface of the second interlayer insulating film, and a second electrode between the first interlayer insulating film and the second interlayer insulating film.

17 Claims, 13 Drawing Sheets

NONVOLATILE MEMORY DEVICES AND METHODS OF FABRICATING THE SAME

CROSS-REFERENCE TO RELATED APPLICATION

This application claims priority under 35 U.S.C. §119 to Korean Patent Application No. 10-2011-0044612, filed on May 12, 2011 in the Korean Intellectual Property Office (KIPO), the entire contents of which is incorporated herein by reference.

BACKGROUND

1. Field

Example embodiments of the inventive concepts relate to nonvolatile memory devices and methods of fabricating the same.

2. Description of the Related Art

Semiconductor memory devices are memory devices implemented using a semiconductor, such as Si, Ge, GaAs, or InP. Semiconductor memory devices are classified as volatile memory devices or nonvolatile memory devices.

The volatile memory devices lose stored data when the power supply is interrupted. Examples of the volatile memory devices include static random access memories (SRAMs), dynamic random access memories (DRAMs), and synchronous dynamic random access memories (SDRAM). The nonvolatile memory devices retain stored date even when the power supply is interrupted. Examples of the nonvolatile memory devices include read-only memories (ROM), programmable read-only memories (PROMs), erasable programmable read-only memories (EPROMs), electrically erasable programmable read-only memories (EEPROMs), flash memories, and resistive memories (e.g., phase-change random access memories (PRAMs), ferroelectric random access memories (FRAM), and resistive random access memories (RRAM)).

SUMMARY

Example embodiments of the inventive concepts may provide resistive memory devices with increased integration density and methods of fabricating resistive memory devices with increased integration density.

According to example embodiments of the inventive concepts, a nonvolatile memory device includes a first interlayer insulating film and a second interlayer insulating film which are separated from each other and are stacked sequentially, a first electrode which penetrates the first interlayer insulating film and the second interlayer insulating film, a resistance change film which is formed along a top surface of the first interlayer insulating film, side surfaces of the first electrode, and a bottom surface of the second interlayer insulating film, and a second electrode which is formed between the first interlayer insulating film and the second interlayer insulating film.

According to other example embodiments of the inventive concepts, a nonvolatile memory device includes a substrate, a plurality of interlayer insulating films which are stacked sequentially on the substrate and are separated from each other, a plurality of first electrodes which penetrate the interlayer insulating films, a plurality of second electrodes, each of which is formed between every two adjacent ones of the stacked interlayer insulating films and which are separated from the first electrodes, and a plurality of resistance change films which are interposed between the first electrodes and the second electrodes, respectively.

According to at least one example embodiment, a nonvolatile memory device includes a first interlayer insulating film, a second interlayer insulating film stacked on the first interlayer insulating film, the first and second interlayer insulating films separated from each other, a first electrode penetrating through the first interlayer insulating film and the second interlayer insulating film, a resistance change film on a top surface of the first interlayer insulating film, a side surface of the first electrode, and a bottom surface of the second interlayer insulating film and a second electrode between the first interlayer insulating film and the second interlayer insulating film.

According to at least one example embodiment, a nonvolatile memory device includes a substrate layer, a plurality of interlayer insulating films stacked on the substrate layer, the interlayer insulating films separated from each other, a plurality of first electrodes penetrating the interlayer insulating films, a plurality of second electrodes, each of the second electrodes between a different adjacent pair of the interlayer insulating films and separated from the first electrodes, and a plurality of resistance change films between the first electrodes and the second electrodes.

According to at least one example embodiment, a semiconductor device includes a conductive pillar, at least three electrodes spaced apart on the conductive pillar, a plurality of insulating layers on the conductive pillar, each of the insulating layers separating a different pair of the electrodes and a variable resistance layer extending in a lengthwise direction of the pillar, the variable resistance layer separating the conductive pillar from each of the electrodes, each of the plurality of insulating layers separating the conductive pillar from the variable resistance layer.

BRIEF DESCRIPTION OF THE DRAWINGS

Example embodiments will be more clearly understood from the following brief description taken in conjunction with the accompanying drawings.

FIG. 1 is a perspective block diagram illustrating resistive memory devices according to example embodiments;

FIG. 2 is a perspective diagram illustrating a memory block of FIG. 1;

FIG. 3 is a cross-sectional view taken along the line III-III' of FIG. 2;

FIG. 4 is an enlarged cross-sectional diagram illustrating a region TS1 of FIG. 3;

FIG. 5 is an enlarged cross-sectional diagram illustrating resistive memory devices according to other example embodiments;

FIG. 6 is a cross-sectional diagram illustrating resistive memory devices according to still other example embodiments;

FIG. 7 is an enlarged cross-sectional diagram illustrating a region TS3 of FIG. 6;

FIG. 8 is an enlarged cross-sectional diagram illustrating resistive memory devices according to further example embodiments;

FIGS. 9-14 are cross-sectional diagrams illustrating intermediate processes in at least one method of fabricating resistive memory devices of FIG. 1;

FIG. 15 is a diagram illustrating an intermediate process in at least one method of fabricating resistive memory devices of FIG. 6;

FIG. 16 is a block diagram illustrating memory systems according to some example embodiments;

FIG. 17 is a block diagram illustrating example applications of the memory systems shown in FIG. 16; and FIG. 18 is a block diagram illustrating computing systems including memory systems of FIG. 17.

Figure 1:
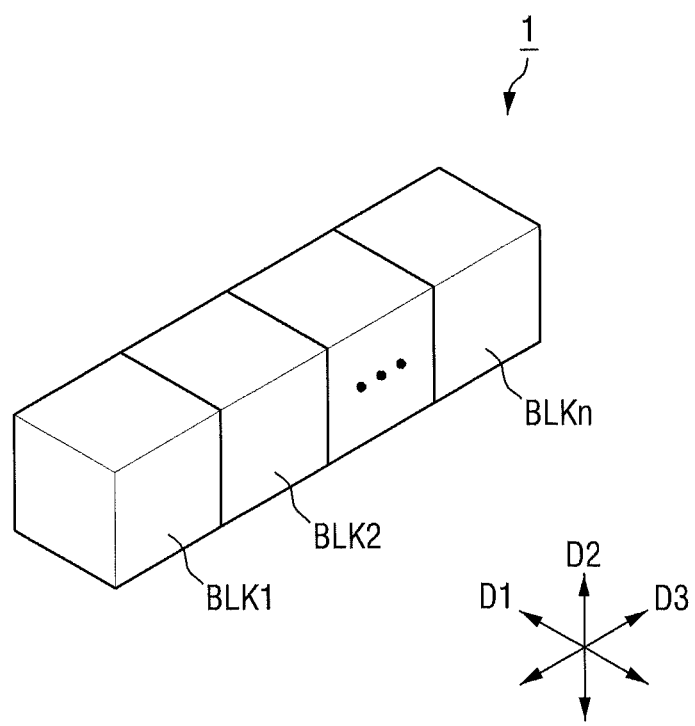
FIGS. 1-18 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
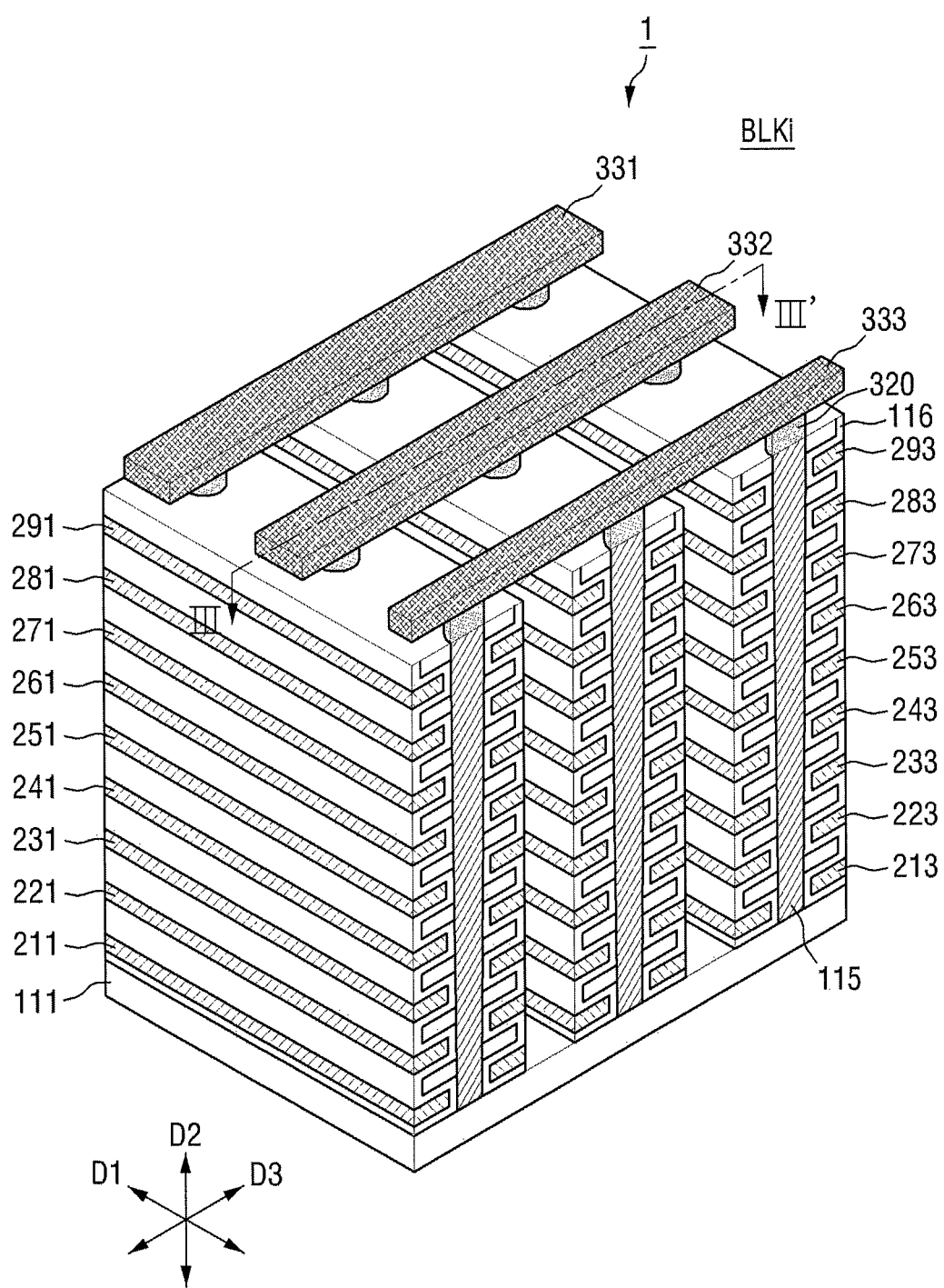
Figure 3:
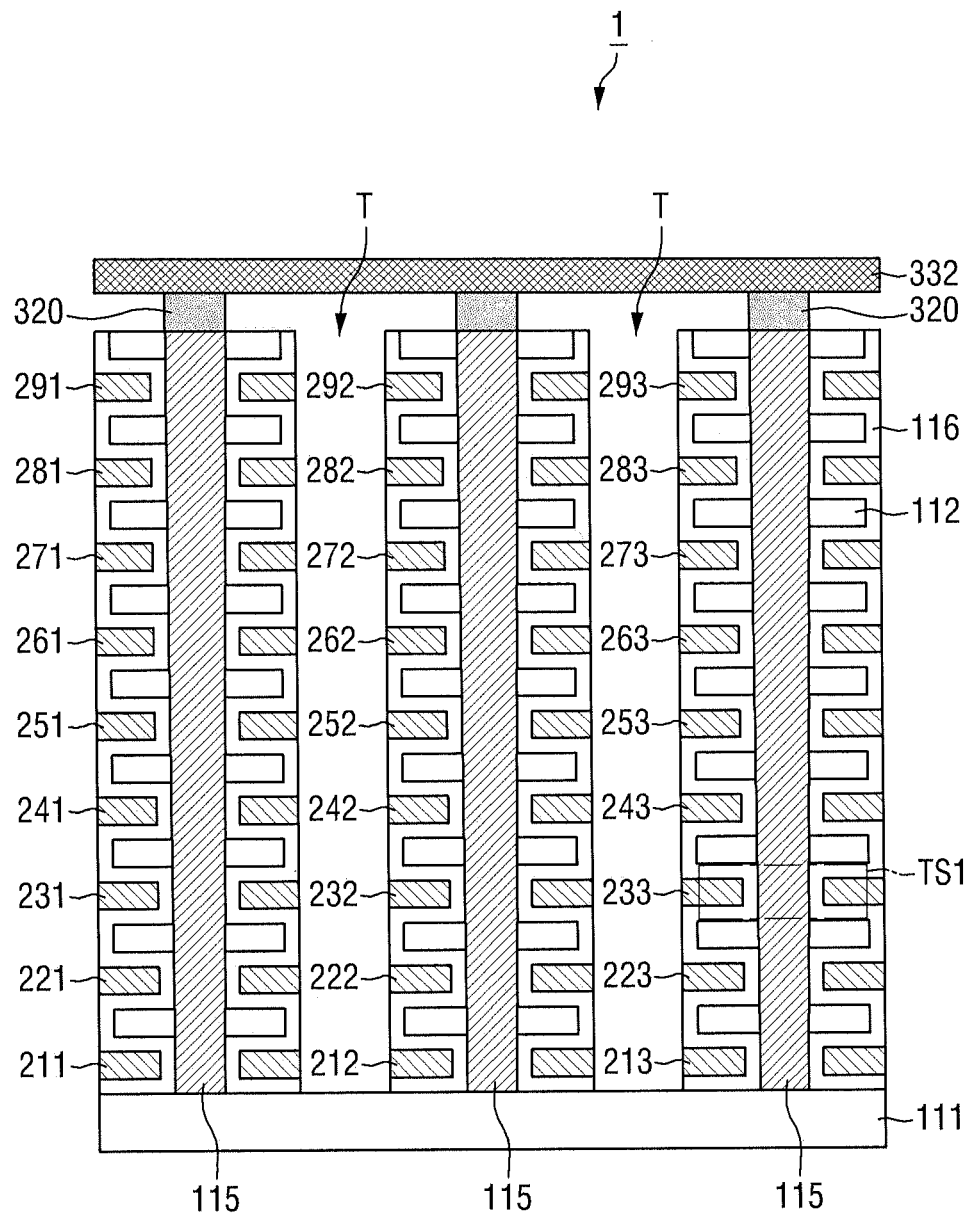
Figure 4:
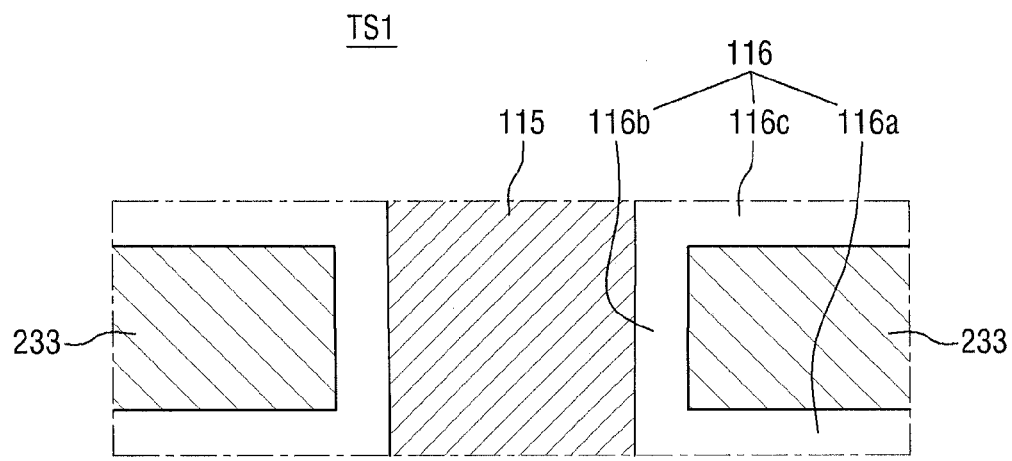

FIG. 1 is a perspective block diagram illustrating resistive memory devices according to example embodiments. FIG. 2 is a perspective diagram illustrating a memory block of FIG. 1. FIG. 3 is a cross-sectional view taken along the line III-III' of FIG. 2. FIG. 4 is an enlarged cross-sectional diagram illustrating a region TS1 of FIG. 3. Referring to FIG. 1, a memory cell array of a resistive memory device 1 according to at least one example embodiment may include a plurality of memory blocks BLK1-BLKn, where n is a natural number. Each of the memory blocks BLK1-BLKn may extend in first through third directions D1-D3. As illustrated in FIG. 1, the first through third directions D1-D3 may be directions that intersect each other and are different from each other. For example, the first through third directions D1-D3 may be, but are not limited to, directions that intersect each other at right angles.

Referring to FIGS. 2-4, a memory block BLKi ($1 \leq i \leq n$, where i is a natural number) may include a plurality of inter-layer insulating films 112, a plurality of first electrodes 115, a plurality of second electrodes 211-291 (e.g., 211, 221, 231, 241, 251, 261, 271, 281 and 291), 212-292 (e.g., 212, 222, 232, 242, 252, 262, 272, 282 and 292) and 213-293 (e.g., 213, 223, 243, 253, 263, 273, 283 and 293), and a plurality of resistance change films 116 on a substrate 111. The interlayer insulating films 112 may be separated from each other in the second direction D2 and may be sequentially stacked on the semiconductor substrate 111 in the second direction D2. As illustrated in FIG. 2, each of the interlayer insulating films 112 may extend in the first direction D1.

The first electrodes 115 may extend in the second direction D2, and the second electrodes 211-291, 212-292 and 213-293 may extend in the first direction D1. The first electrodes 115 may be on the substrate 111 in the form of pillars and may penetrate the stacked interlayer insulating films 112. Each of the second electrodes 211-291, 212-292 and 213-293 may be between a different pair of adjacent stacked interlayer insulating films 112. The second electrodes 211-291, 212-292 and 213-293 may be separated from the first electrodes 115 and may intersect the first electrodes 115. First electrodes spaced in the direction D3 may be connected by one of bit lines 331-333 through connection pads and/or plugs 320.

The first electrodes 115 may be, but are not limited to, Ru, RuOx, Ti/TiN, Zr/TiN, NiSix, TiN, Wn, W, Al, Cu, and/or an alloy of these materials. The second electrodes 211-291, 212-292 and 213-293 may be, but are not limited to, Ti/TiN, Ta/TiN, W, Pt, Pd, Rh, Ru, Ir and/or an alloy of these materials. The resistance change films 116 may be between the first electrodes 115 and the second electrodes 211-291, 212-292 and 213-293. The resistance change films 116 may extend in the first direction D1. The resistance change films 116 may be formed in a zigzag shape in the second direction D2. In each region in which one of the first electrodes 115 intersect one of the second electrodes 211-291, 212-292 and 213-293 there may be a resistive memory cell TS1.

Each of the resistance change films 116 may be along a top surface (see 116a in FIG. 4) of an interlayer insulating film 112, side surfaces (see 116b in FIG. 4) of a first electrode 115, and a bottom surface (see 116c in FIG. 4) of another interlayer insulating film 112, and/or a different portion of an interlayer insulating film 112. The resistance change films 116 may be conforming or conformal to the shapes of the interlayer insulating films 112 and the first electrodes 115. Each of the second electrodes 211-291, 212-292 and 213-293 may fill a space between an interlayer insulating film 112 that may be disposed thereunder and another interlayer insulating film 112 that may be disposed thereon. The resistance change films 116 may be, for example, a transition metal oxide (TMO). For example, the resistance change films 116 may be, but are not limited to, HfOx, TiOx, TaOx, ZnO, $Ti_2O$, $Nb_2O_5$, $ZrO_2$ and/or NiO.

Referring to FIGS. 2 and 3, the first electrodes 115 may be separated in the first direction D1 and the third direction D3. The first electrodes 115 may be arranged in a matrix. In the drawings, the first electrodes 115 may be arranged in a 3×3 matrix. However, example embodiments of the inventive concepts are not limited thereto. A trench T may be in the interlayer insulating films 112 between every two adjacent first electrodes 115 arranged in the third direction D3. The first electrodes 115 arranged in the third direction D3 may be electrically connected to each other by bit lines 331-333. The first electrodes 115 that may be arranged in the first direction D1 may be electrically connected to each other by the resistance change films 116 that may extend in the first direction D1.

Figure 5:
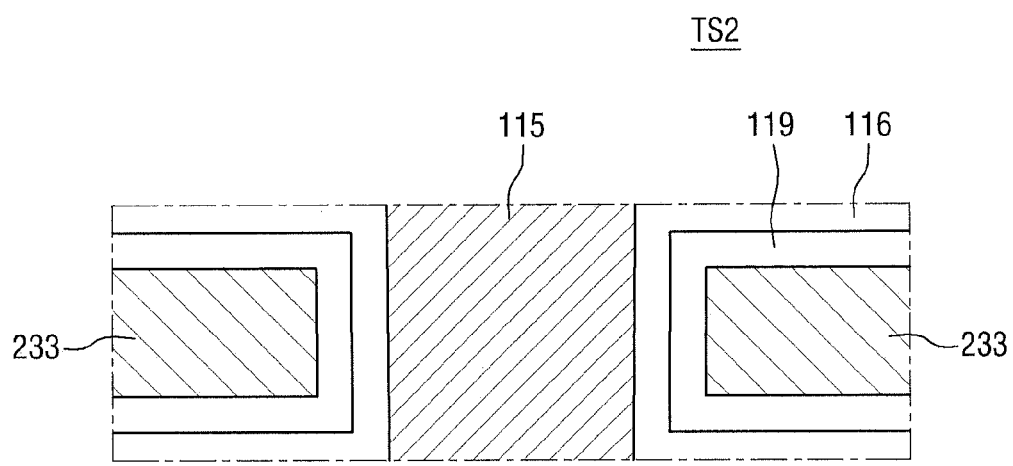

FIG. 5 is an enlarged cross-sectional diagram illustrating resistive memory devices 3 according to other example embodiments. The following description may describe differences from the resistive memory device 1 and description of like elements may be omitted. Referring to FIG. 5, a resistive memory cell TS2 in a resistive memory device 2 according to at least one example embodiment may further include a two-way diode 119 that may be between a first electrode 115 and a second electrode (e.g., 233). The two-way diode 119 may be, for example, $VO_2$. The two-way diode 119 may be along a top surface of an interlayer insulating film 112, side surfaces of the first electrode 115 and a bottom surface of another interlayer insulating film 112. The two-way diode 119 may be between a resistance change film 116 and the second electrode 233. However, example embodiments are not limited thereto. For example, according to at least one example embodiment the two-way diode 119 may be between the first electrode 115 and the resistance change film 116.

Figure 6:
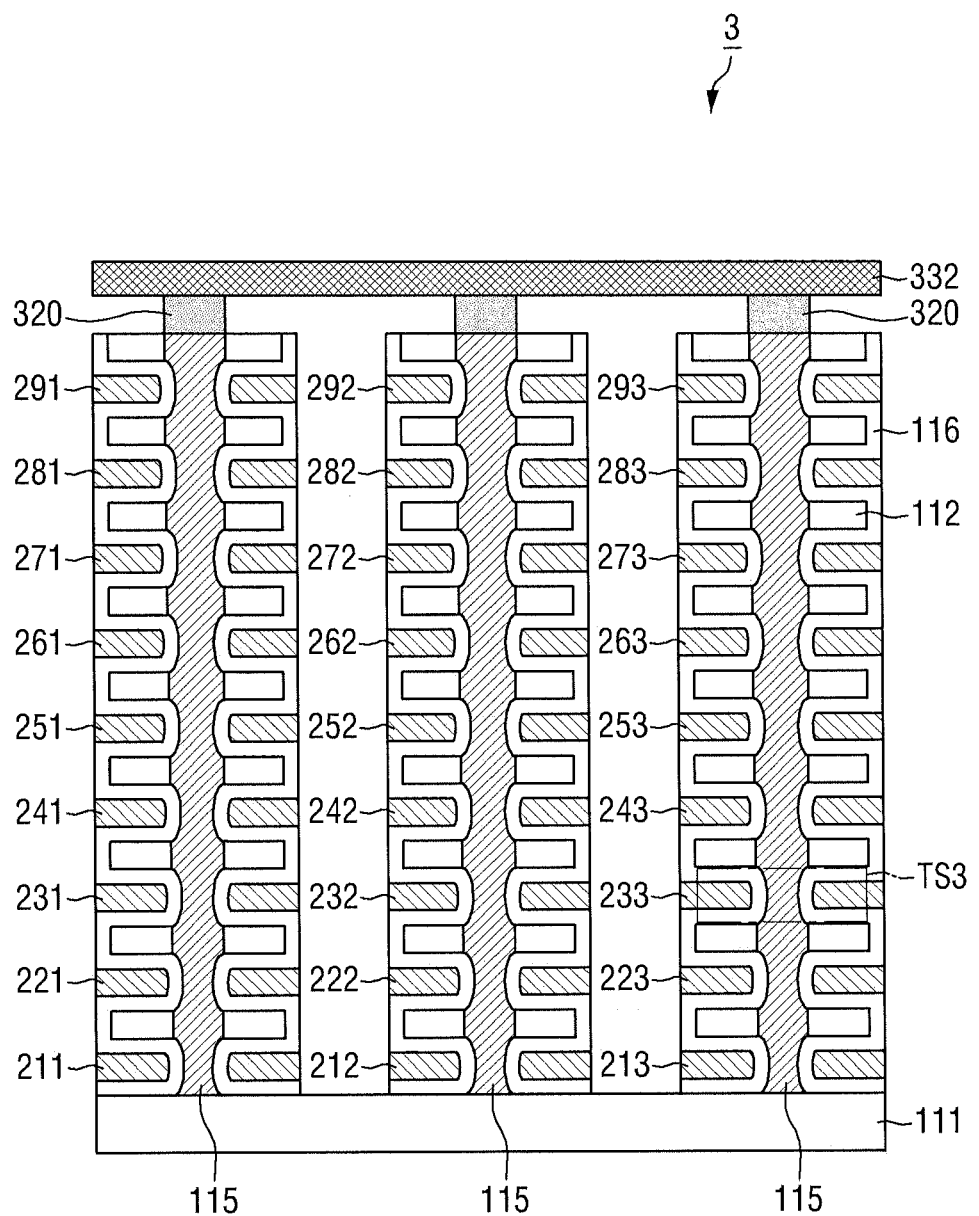
Figure 7:
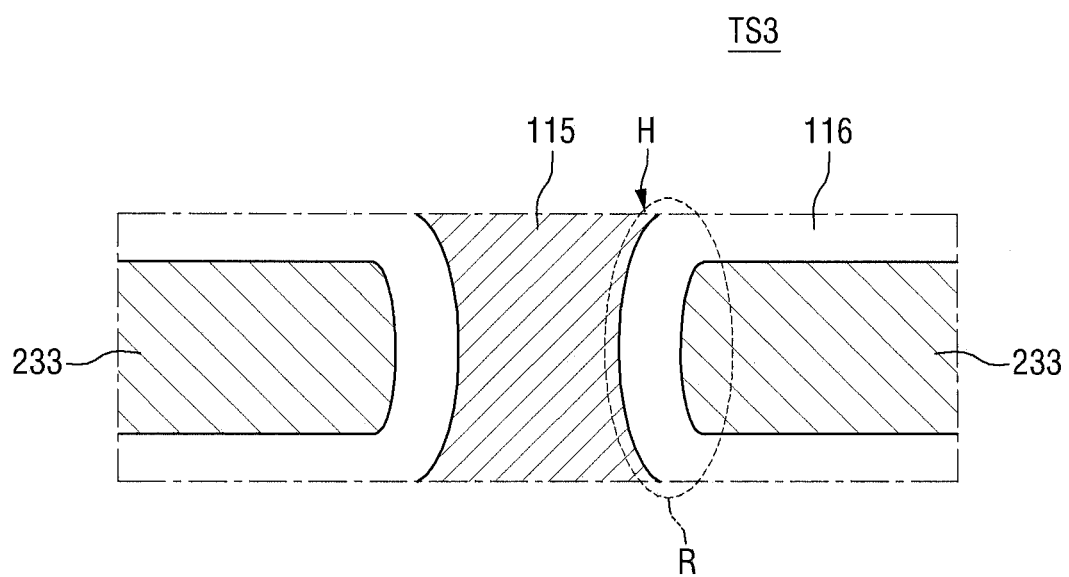

FIG. 6 is a cross-sectional diagram illustrating resistive memory devices 3 according to still other example embodiments. FIG. 7 is an enlarged cross-sectional diagram illustrating a region TS3 of FIG. 6. The following description may describe differences from the resistive memory device 1 and description of like elements may be omitted. Referring to FIGS. 6 and 7, each side surface of each of first electrodes 115 in the resistive memory device 3 according to example embodiments may include a plurality of grooves H. Each of the grooves H may be between an interlayer insulating film 112 that may be thereon and another interlayer insulating film 112 that may be thereunder. A resistance change film 116 may be along the grooves H of each side surface of each of the first electrodes 115. Surfaces of the resistance change film(s) 116 between one of the first electrodes 115 and each group of second electrodes 211-291, 212-292 and/or 213-293 may be curved surfaces (e.g., curved surfaces R). When a bias is applied to one of the first electrodes 115 and at least one of the second electrodes 211-291, 212-292 and 213-293, an electric field may not be concentrated in a certain area. The electric field may be evenly distributed over an entire curved surface R of the resistance change film 116. Filaments may be evenly induced over the entire curved surface R of the resistance change film 116. Filaments may be prevented and/or reduced in unwanted areas of the resistance change film 116 and with a uniformity of the filaments may be increased.

Figure 8:
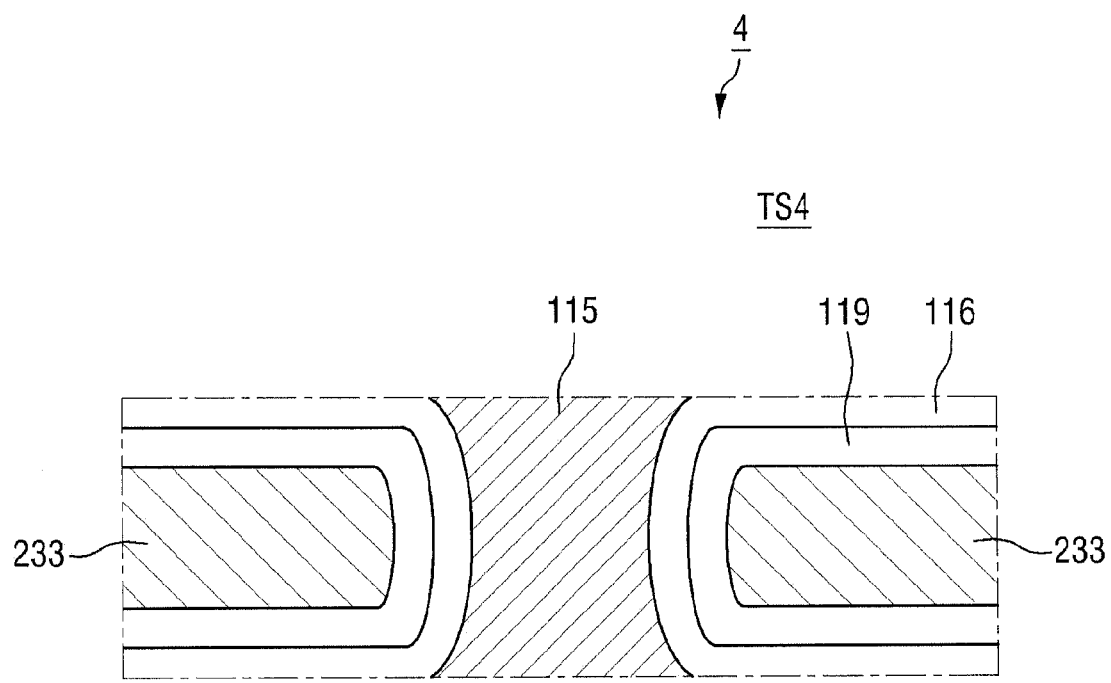

FIG. 8 is an enlarged cross-sectional diagram illustrating resistive memory devices 4 according to further example embodiments. The following description may describe differences from the resistive memory device 3 and description of like elements may be omitted. Referring to FIG. 8, a resistive memory cell TS4 in a resistive memory device 4 according to example embodiments may include a two-way diode 119 between a first electrode 115 and a second electrode (e.g., 233). The two-way diode 119 may be along a top surface of an interlayer insulating film 112, side surfaces of the first electrode 115, and a bottom surface of another interlayer insulating film 112. In FIG. 8, the two-way diode 119 may be between a resistance change film 116 and a second electrode 233. However, example embodiments are not limited thereto. For example, the two-way diode 119 may be between the first electrode 115 and the resistance change film 116 and/or between the resistance change film 116 and the second electrode 233.

Figure 9:
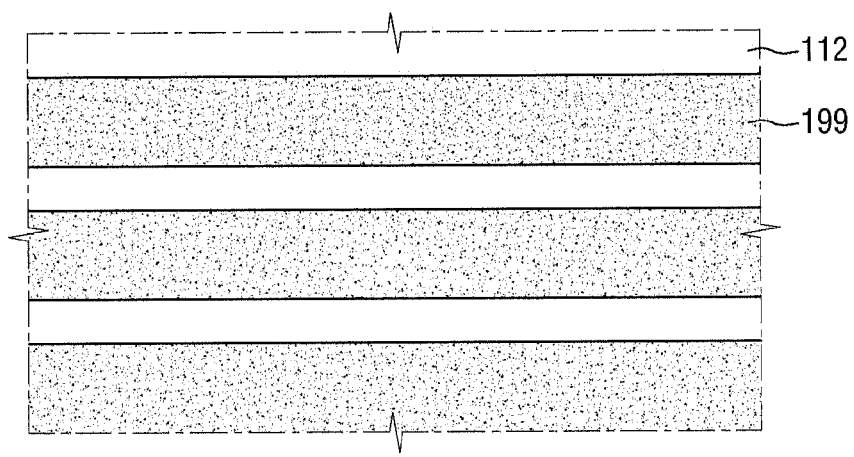
Figure 10:
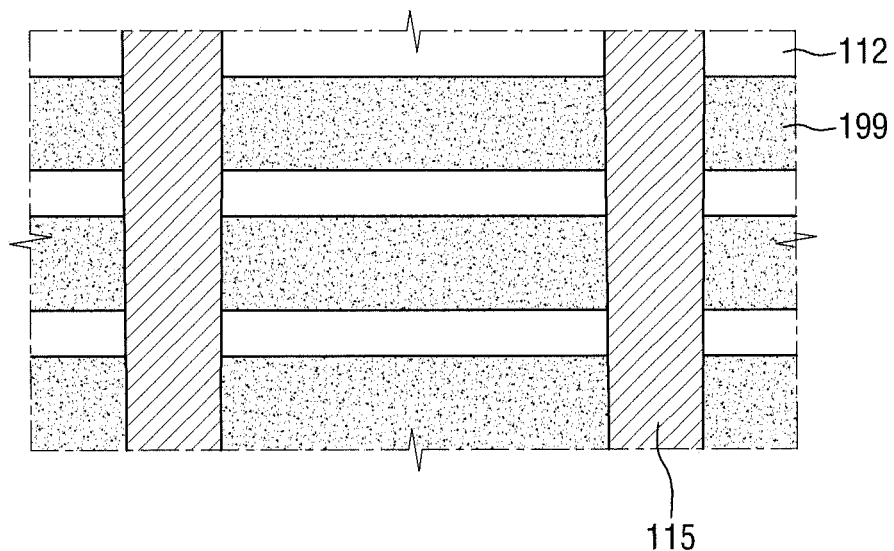

FIGS. 9-14 are cross-sectional diagrams illustrating intermediate processes in at least one method of fabricating a resistive memory device 1 of FIG. 1. Referring to FIG. 9, a plurality of sacrificial films 199 and a plurality of interlayer insulating films 112 may be stacked alternately. The sacrificial films 199 and the interlayer insulating films 112 may be materials with different etch rates. For example, the sacrificial films 199 may be nitride films, and the interlayer insulating films 112 may be oxide films. Referring to FIG. 10, a plurality of first electrodes 115 may be formed in the shape of pillars to penetrate the sacrificial films 199 and the interlayer insulating films 112. Through holes may penetrate the sacrificial films 199 and the interlayer insulating films 112 may be formed by, for example, anisotropic etching. The through holes may be filled (e.g., completely filled) with a first electrode material using, for example, chemical vapor deposition (CVD), physical vapor deposition (PVD) and/or atomic layer deposition (ALD). The first electrode material may be, but is not limited to, Ru, RuOx, Ti/TiN, Zr/TiN, NiSix, TiN, Wn, W, Al, Cu and/or an alloy of these materials.

Figure 11:
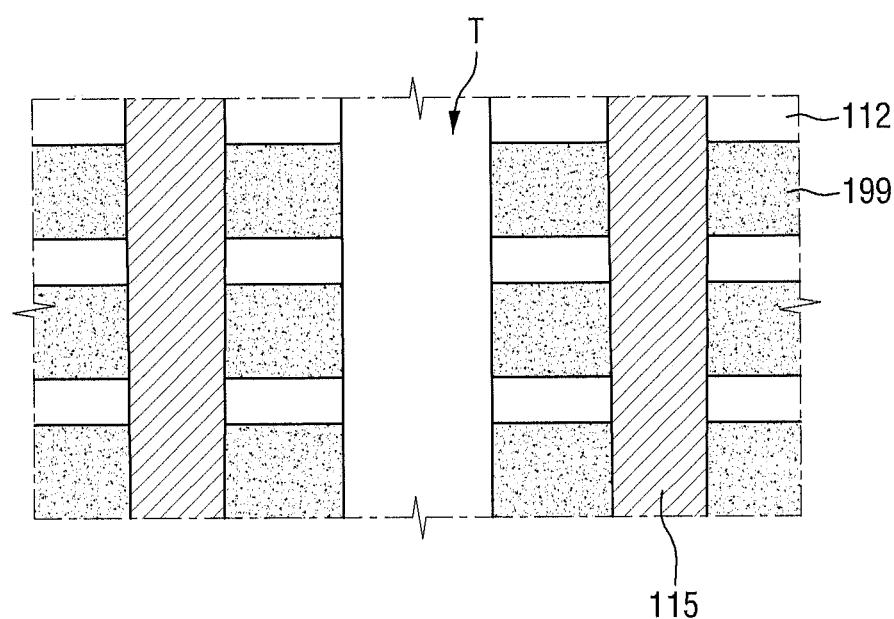
Figure 12:
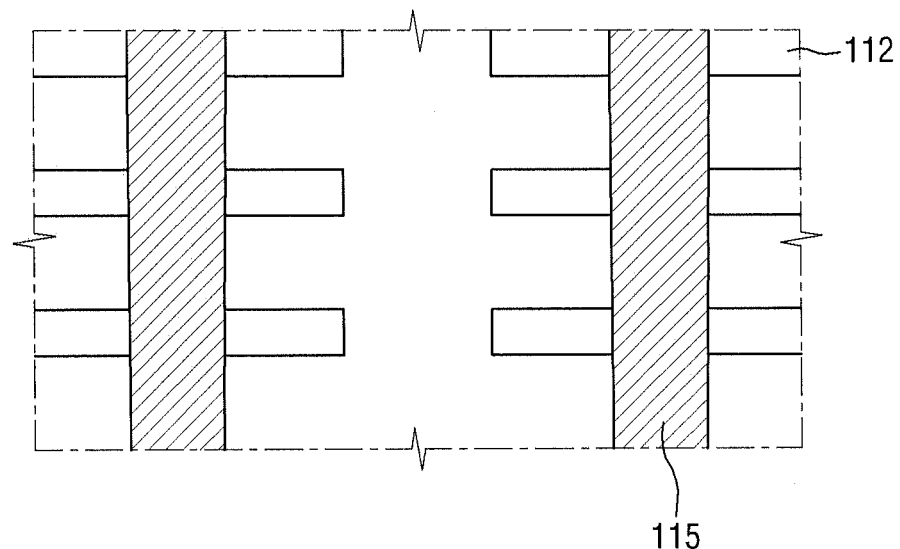

Referring to FIGS. 11 and 12, regions of each side surface of each of the first electrodes 115 may be exposed by removing the sacrificial films 199. The sacrificial films 199 and part of the interlayer insulating films 112 may be removed to form a trench T which may be separated from each of the first electrodes 115 as illustrated in FIG. 11. A trench T may be formed between every two adjacent first electrodes 115. The sacrificial films 199 may be removed by, for example, wet etching as illustrated in FIG. 12. The process of removing the sacrificial films 199 may be referred to as a pull-back process. The pull-back process may use, for example, phosphoric acid, sulfuric acid, hydrochloric acid and/or a mixture of these solutions.

Figure 13:
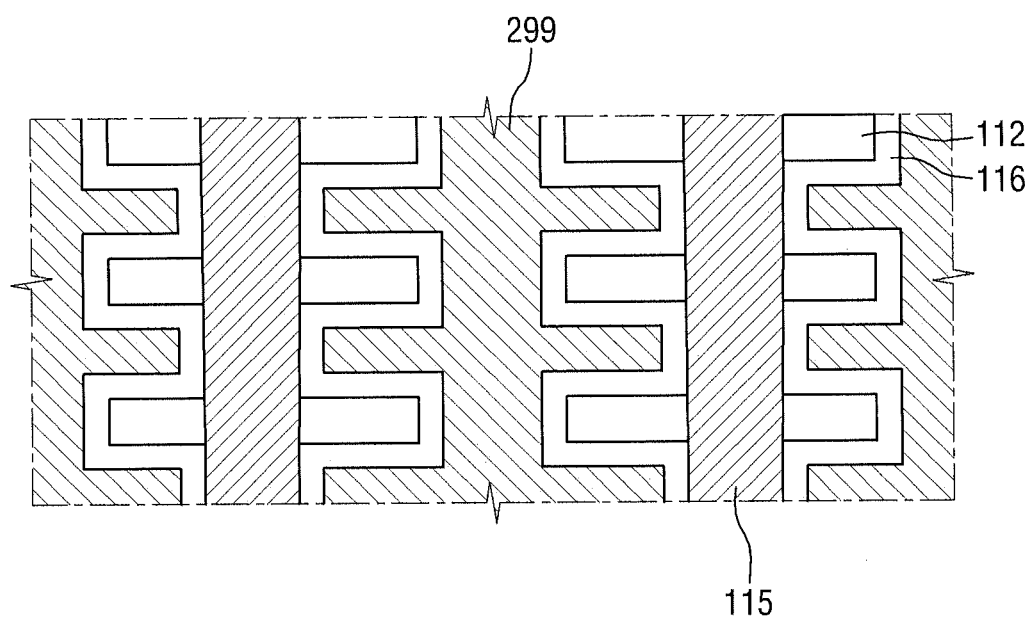
Figure 14:
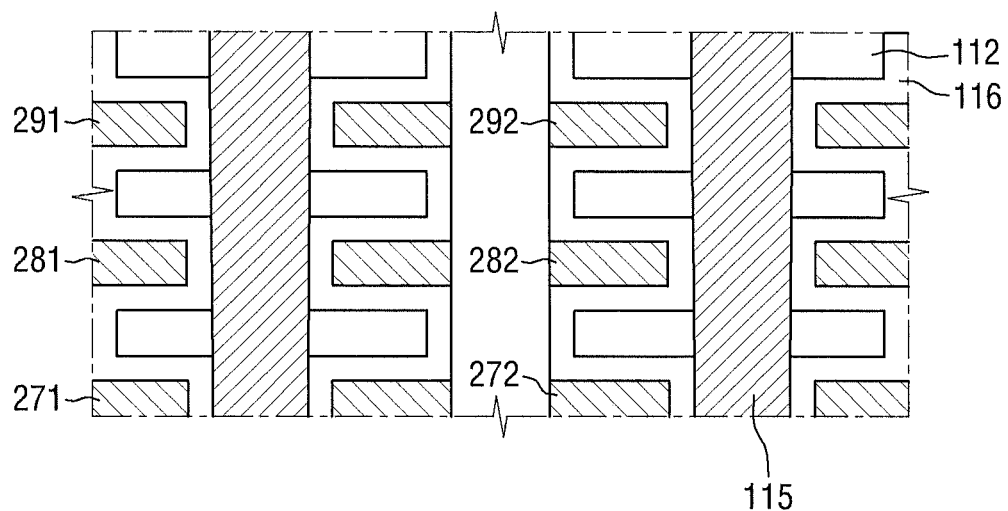

Referring to FIGS. 13 and 14, a plurality of resistance change films 116 may be formed along top and bottom surfaces of the interlayer insulating films 112 and the exposed regions of the side surfaces of the first electrodes 115. A resistance change material and a conductive material 299 may be sequentially formed as illustrated in FIG. 13. Part of the conductive material 299 may be removed to complete each group of second electrodes 211-291, 212-292 and/or 213-293 which may be separated from each other by the interlayer insulating films 112, as illustrated in FIG. 14.

The forming of the resistance change films 116 and the forming of the second electrodes 211-291, 212-292 and 213-293 (the forming of the conductive material 299 for forming the second electrodes 211-291, 212-292 and 213-293) may include using an in-situ method. The forming of the resistance change films 116 and the forming of the second electrodes 211-291, 212-292 and 213-293 may use, for example, ALD and/or CVD. However, example embodiments are not limited thereto. The resistance change films 116 may be, for example a TMO. The resistance change films 116 may be, but are not limited to, HfOx, TiOx, TaOx, ZnO, $Ti_2O$, $Nb_2O_5$, $ZrO_2$ and/or NiO. The second electrodes 211-291, 212-292 and 213-293 may be, but are not be limited to, Ti/TiN, Ta/TiN, W, Pt, Pd, Rh, Ru, Ir, and/or an alloy of these materials.

Figure 15:
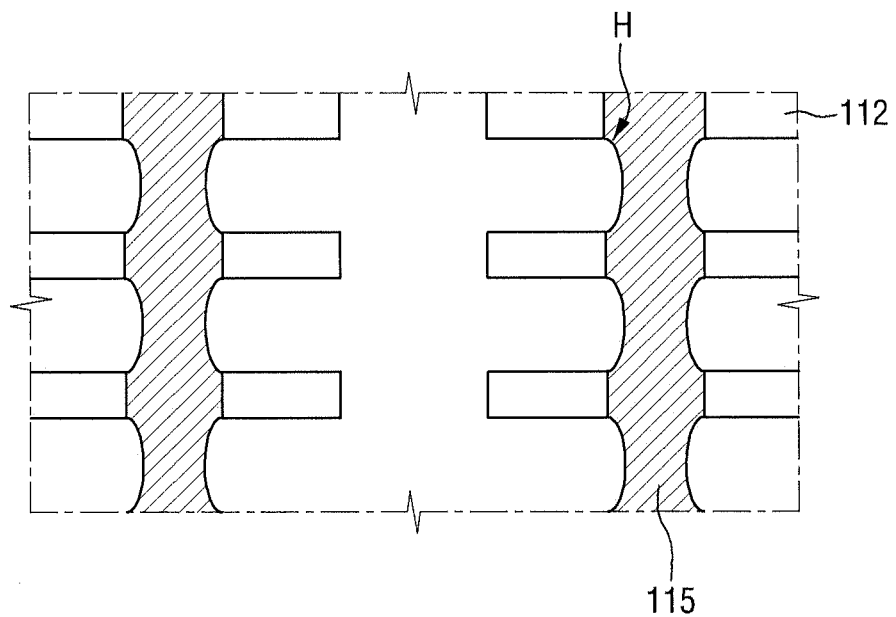

FIG. 15 is a diagram illustrating an intermediate process in at least one method of fabricating a resistive memory device 3 of FIG. 6. Method of fabricating the resistive memory device 3 according to example embodiments may be similar to methods of fabricating the resistive memory device 1 according to example embodiments. Therefore, description of the same or similar processes may be omitted. A method of fabricating the resistive memory device 3 according to example embodiments may further include a process of FIG. 15 between the process (the removing of sacrificial films) of FIG. 12 and the process (the forming of a resistance change material and a conductive material) of FIG. 13.

Referring to FIG. 15, grooves H may be formed in regions of side surfaces of each first electrode 115 which may be exposed between pairs of interlayer insulating films 112. For example, wet etch and/or dry etch may be performed using an etch selectivity between the interlayer insulating films 112 and the first electrodes 115, thereby forming the grooves H. A dry etch process may use at least one of $Cl_2$, $NH_3$ and/or $CCl_4$.

Figure 16:
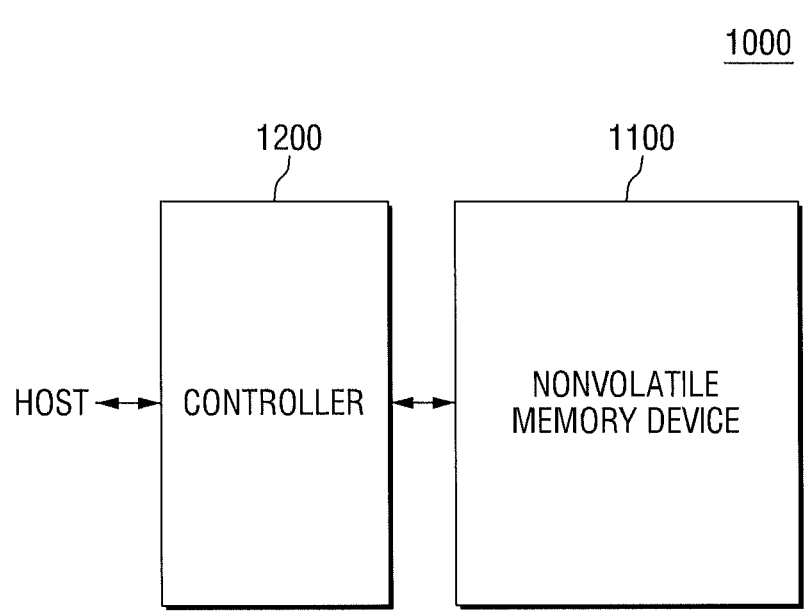

FIG. 16 is a block diagram illustrating memory systems according to some example embodiments. Referring to FIG. 16, a memory system 1000 may include a nonvolatile memory device 1100 and a controller 1200. The nonvolatile memory device 1100 may be one of the memory devices described above with reference to FIGS. 1-8. The controller 1200 may be connected to a host HOST and the nonvolatile memory device 1100. The controller 1200 may be configured to access the nonvolatile memory device 1100 in response to a request from the host. For example, the controller 1200 may be configured to control read/write/erase/background operations of the nonvolatile memory device 1100. The controller 1200 may be configured to provide an interface between the nonvolatile memory device 1100 and the host HOST. The controller 1200 may be configured to drive firmware for controlling the nonvolatile memory device 1100.

The controller 1200 may include well-known components, for example, a random access memory (RAM), a processing unit, a host interface and/or a memory interface. The RAM may be used as at least one of a working memory of the processing unit, a cache memory between the nonvolatile memory device 1100 and the host, and a buffer memory between the nonvolatile memory device 1100 and the host. The processing unit may control the overall operation of the controller 1200. The host interface may include a protocol for data exchange between the host HOST and the controller 1200. For example, the controller 1200 may be configured to communicate with an external device (e.g., the host HOST) using at least one of various interface protocols.

The interface protocols may include, for example, a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol and/or an integrated drive electronics (IDE) protocol. The memory interface may interface with the nonvolatile memory device 1100. For example, the memory interface may include a NAND interface and/or a NOR interface.

The memory system 1000 may further include an error correction block (not shown). The error correction block may be configured to detect and correct an error in data read from the nonvolatile memory device 1100 by using an error correction code (ECC). For example, the error correction block may be provided as a component of the controller 1200. The error correction block may also be provided as a component of the nonvolatile memory device 1100. The controller 1200 and the nonvolatile memory device 1100 may be integrated into one semiconductor device. As an example, the controller 1200 and the nonvolatile memory device 1100 may be integrated into one semiconductor device as a memory card. For example, the controller 1200 and the nonvolatile memory device 1100 may be integrated into one semiconductor device as a personal computer (PC) card (e.g., Personal Computer Memory Card International Association (PCMCIA)), a compact flash card (CF), a smart media card (SM/SMC), a memory stick, a multimedia card (e.g., MMC, RS-MMC and MMCmicro), a SD card (e.g., SD, miniSD, microSD, and SDHC), and/or a universal flash storage (UFS).

As another example, the controller 1200 and the nonvolatile memory device 1100 may be integrated into one semiconductor device as a solid state drive (SSD). The SSD may include a storage device which may store data in a semiconductor memory. When the memory system 1000 may be used as an SSD, the operation speed of the host connected to the memory system 1000 may increase significantly.

The memory system 1000 may be applicable to computers, ultra-mobile PCs (UMPCs), workstations, net-books, personal digital assistants (PDAs), portable computers, web tablets, wireless phones, mobile phones, smart phones, e-books, portable multimedia players (PMPs), portable game devices, navigation devices, black boxes, digital cameras, three-dimensional televisions, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, a radio frequency identification (RFID) device and/or various components constituting a computing system.

The nonvolatile memory device 1100 and/or the memory system 1000 may be mounted in various types of packages. Examples of packages that may include the nonvolatile memory device 1100 and/or the memory system 1000 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

Figure 17:
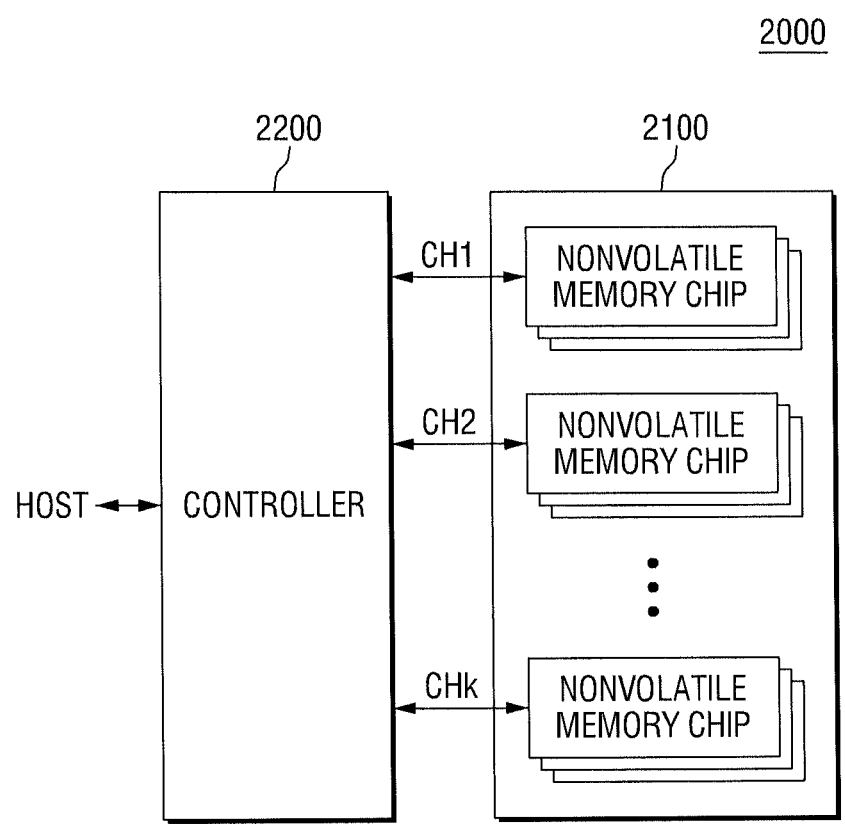

FIG. 17 is a block diagram illustrating example applications of the memory systems shown in FIG. 16. Referring to FIG. 17, a memory system 2000 may include a nonvolatile memory device 2100 and a controller 2200. The nonvolatile memory device 2100 may include a plurality of nonvolatile memory chips. The nonvolatile memory chips may form multiple memory chip groups. Each of the memory chip groups may have a common channel for communication with the controller 2200. For example, the nonvolatile memory chips may communicate with the controller 2200 through first through $k^{th}$ channels CH1-CHk. Each of the nonvolatile memory chips may include at least one of the nonvolatile memory devices 1-4 described above with reference to FIGS. 1-8. A plurality of nonvolatile memory chips may be connected to one channel. However, the memory system 2000 may be modified, for example, such that one nonvolatile memory chip may be connected to one channel.

Figure 18:
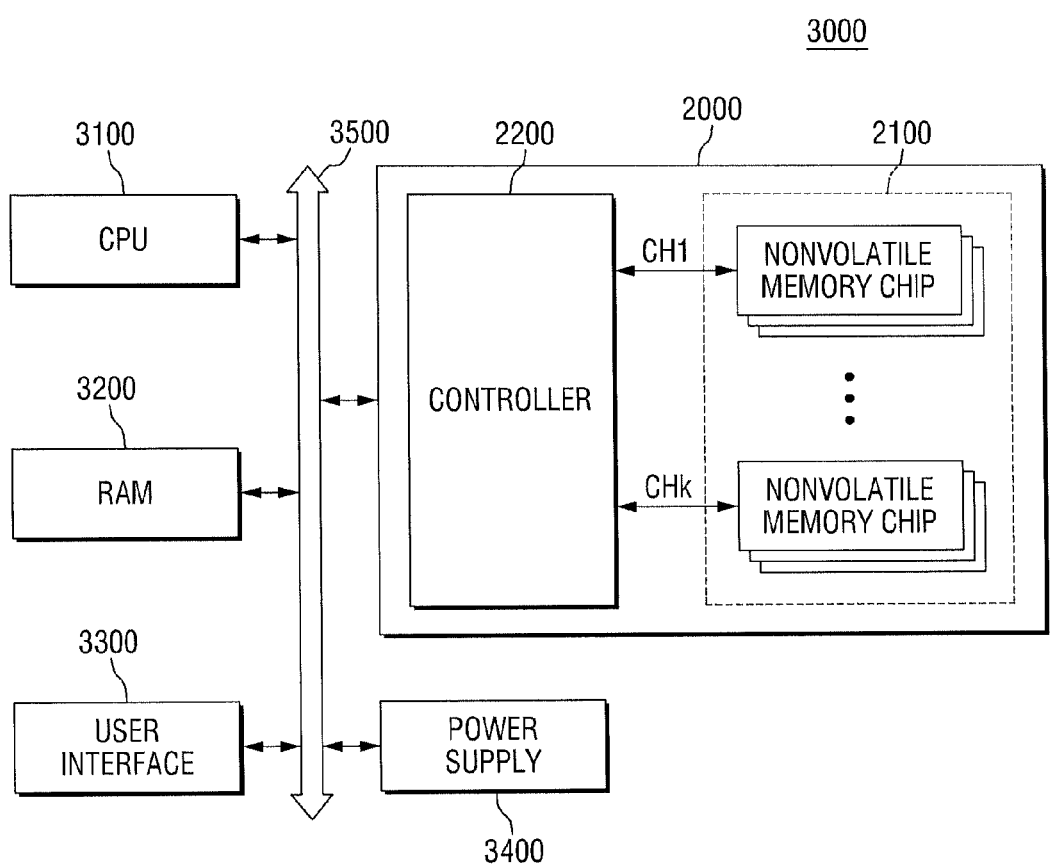

FIG. 18 is a block diagram illustrating computing systems including a memory system of FIG. 17. Referring to FIG. 18, a computing system 3000 may include a central processing unit (CPU) 3100, a RAM 3200, a user interface 3300, a power supply 3400 and a memory system 2000. The memory system 2000 may be electrically connected through a system bus 3500 to the CPU 3100, the RAM 3200, the user interface 3300 and the power supply 3400. Data, which may be provided through the user interface 3300 and/or processed by the CPU 3100, may be stored in the memory system 2000. The nonvolatile memory device 2100 may be connected to the system bus 3500 through the controller 2200. However, the nonvolatile memory device 2100 may also, for example, be connected directly to the system bus 3500.

In FIG. 18, the memory system 2000 described above with reference to FIG. 17 is provided. However, the memory system 2000 may be replaced by, for example, the memory system 1000 described above with reference to FIG. 16. The computing system 3000 may also include each of the memory systems 1000 and 2000 described above with reference to FIGS. 16 and 17.

While example embodiments have been particularly shown and described, it will be understood by one of ordinary skill in the art that variations in form and detail may be made therein without departing from the spirit and scope of the claims.

What is claimed is:

1. A nonvolatile memory device, comprising:
   a first interlayer insulating film;
   a second interlayer insulating film on the first interlayer insulating film, the first and second interlayer insulating films separated from each other;
   a first electrode penetrating through or extending adjacent to the first interlayer insulating film and the second interlayer insulating film;
   a resistance change film on a top surface of the first interlayer insulating film and a bottom surface of the second interlayer insulating film and adjacent a side surface of the first electrode;
   a second electrode between the first interlayer insulating film and the second interlayer insulating film; and
   a two-way diode between the first electrode and the second electrode,
   wherein the diode is on the top surface of the first interlayer insulating film and the bottom surface of the second interlayer insulating film and is adjacent to at least one of the side surface of the first electrode and a side surface of the second electrode.

2. The memory device of claim 1, wherein:
   the side surface of the first electrode includes a groove extending between the first interlayer insulating film and the second interlayer insulating film, and
   the resistance change film is adjacent the groove on the side surface of the first electrode.

3. The memory device of claim 1, wherein:
   the second electrode includes a top surface, the bottom surface and the side surface, and
   the resistance change film is on the top and bottom surfaces of the second electrode, and is adjacent to the side surface of the second electrode.

4. The memory device of claim 1, wherein the resistance change film includes a transition metal oxide (TMO).

5. The memory device of claim 2, wherein the side surface of the first electrode which includes the groove is curved.

6. A nonvolatile memory device, comprising:
   a substrate layer;
   a plurality of interlayer insulating films on the substrate layer, the interlayer insulating films separated from each other;
   a plurality of first electrodes penetrating through or extending adjacent to the interlayer insulating films;
   a plurality of second electrodes, each of the second electrodes between a different adjacent pair of the interlayer insulating films and separated from the first electrodes;
   a resistance change film at least partially between at least one of the first electrodes and a number of the second electrodes; and
   a two-way diode between the at least one of the first electrodes and the number of the second electrodes, wherein the two-way diode overlaps top and bottom surfaces of at least some of the interlayer insulating films and is adjacent to a side surface of at least one of the first electrodes.

7. The memory device of claim 6, wherein the resistance change film is on top and bottom surfaces of the interlayer insulating films and is adjacent to the side surface of the at least one of the first electrodes.

8. The memory device of claim 6, wherein:
a side surface of each of the first electrodes includes a plurality of grooves between respective pairs the interlayer insulating films,
the resistance change film is in alignment with the grooves in said at least one of the first electrodes.

9. The memory device of claim 6, further comprising:
a trench between an adjacent pair of the first electrodes, wherein
the first electrodes are arranged in first and second directions parallel to the substrate layer,
the adjacent pair of the first electrodes are arranged in the first direction, and
the trench extends in a third direction.

10. The memory device of claim 7, wherein:
each of the second electrodes includes a top surface, a bottom surface and a side surface, and
the resistance change film surrounds the top and bottom surfaces and at least a part of the side surface of the number of the second electrodes.

11. The memory device of claim 8, wherein the side surfaces of the first electrodes including the grooves are curved.

12. The memory device of claim 9, wherein first electrodes arranged in the first direction are electrically connected to each other by a bit line.

13. The memory device of claim 9, wherein the resistance change film is coupled to the first electrodes arranged in the second direction.

14. A vertical semiconductor device, comprising:
a conductive pillar;
at least three electrodes spaced apart and adjacent to the conductive pillar;
a plurality of insulating layers adjacent the conductive pillar, each of the insulating layers separating a different pair of the electrodes;
a variable resistance layer extending in a direction of the pillar, the variable resistance layer separating the conductive pillar from each of the electrodes, each of the plurality of insulating layers separating the conductive pillar from the variable resistance layer; and
a diode layer,
wherein portions of the variable resistance layer separating the conductive pillar from the electrodes are one of in direct contact with the conductive pillar or separated from the conductive pillar by the diode layer, and each of the insulating layers separates the diode layer from the conductive pillar.

15. The vertical semiconductor device of claim 14, wherein the variable resistance layer separates the electrodes from the insulating layers.

16. The vertical semiconductor device of claim 14, wherein a surface of the conductive pillar between each pair of insulating layers is substantially concave.

17. A memory system, comprising:
a controller; and
the nonvolatile memory device of claim 1.

* * * * *